(12) United States Patent
Kharrat et al.

(10) Patent No.: US 8,614,609 B2
(45) Date of Patent: Dec. 24, 2013

(54) RESONANT FILTER BASED ON AN N/MEMS MATRIX

(75) Inventors: Chady Kharrat, Voiron (FR); Eric Colinet, Meylan (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 525 days.

(21) Appl. No.: 12/936,773

(22) PCT Filed: Apr. 6, 2009

(86) PCT No.: PCT/EP2009/054100
§ 371 (c)(1), (2), (4) Date: Jan. 21, 2011

(87) PCT Pub. No.: WO2009/124914
PCT Pub. Date: Oct. 15, 2009

(65) Prior Publication Data
US 2011/0128095 A1  Jun. 2, 2011

(30) Foreign Application Priority Data
Apr. 8, 2008 (FR) ...................................... 08 52345

(51) Int. Cl.
*H03H 9/00* (2006.01)
*H03H 9/13* (2006.01)

(52) U.S. Cl.
USPC .......................................... 333/186; 333/197

(58) Field of Classification Search
USPC ......... 333/186, 187, 188, 197, 198, 202, 219, 333/219.1
See application file for complete search history.

(56) References Cited

U.S. PATENT DOCUMENTS

| | | | | |
|---|---|---|---|---|
| 7,463,105 B2* | 12/2008 | Morita et al. | ................. | 331/154 |
| 7,498,901 B2* | 3/2009 | Naniwada et al. | ............ | 333/133 |
| 7,570,134 B2* | 8/2009 | Koji | .............................. | 333/186 |
| 2004/0124951 A1 | 7/2004 | Nakamura et al. | | |
| 2006/0170508 A1 | 8/2006 | Tanaka | | |
| 2010/0141355 A1 | 6/2010 | Kharrat et al. | | |

FOREIGN PATENT DOCUMENTS

EP  1 475 856  11/2004

OTHER PUBLICATIONS

Li, Sheng-Shian, et al., "A Micromechanical Parallel-Class Disk-Array Filter", Frequency Control Symposium, IEEE International, pp. 1356-1361, XP 031138187, (May 1, 2007).
Li, Sheng-Shian, et al., "An MSI Micromechanical Differential Disk-Array Filter", Solid-State Sensors, Actuators and Microsystems Conference, Transducers 2007 International, IEEE, pp. 307-311, XP 03113190, (Jun. 1, 2007).

(Continued)

*Primary Examiner* — Dean O Takaoka
(74) *Attorney, Agent, or Firm* — Oblon, Spivak, McClelland, Maier & Neustadt, L.L.P.

(57) ABSTRACT

A resonant filter including a matrix of n×m resonators of N/MEMS type, each resonator including an actuating mechanism and a detection mechanism. An input of the filter, configured to receive an electrical input signal, is electrically connected to the resonator actuating mechanism. The outputs of the resonator detecting mechanism are electrically connected together and to an output of the filter, such that the signal to be obtained as an output of the filter is an image of the sum of the mechanical responses of the resonators. The resonators are not mechanically coupled together.

17 Claims, 8 Drawing Sheets

(56) References Cited

OTHER PUBLICATIONS

Clark, John R., et al., "Parallel-Coupled Square-Resonator Micromechanical Filter Arrays", International Frequency Control Symposium and Exposition, 2006 IEEE, pp. 485-490, (Jun. 1, 2006).

Shen, S.-H., et al., "Design Considerations for an Acoustic MEMS Filter", Microsystem Technologies, vol. 10, pp. 585-591, (2004).

Gurbuz, Yasar et al., "An Analytical Design Methodology for Microelectromechanical (MEM) filters", Sensors and Actuators A, vol. 119, pp. 38-47, (Nov. 30, 2004).

Wang, Kun et al., "High-Order Medium Frequency Micromechanical Electronic Filters", Journal of Microelectromechanical Systems, vol. 8, No. 4, pp. 534-557, (Dec. 1999).

Stephanou, P.J., et al., "Design of Novel Mechanical Coupling for Contour Mode Piezoelectric RF MEMES Filters", Journal of Physics, Conference Series, vol. 34, pp. 342-349, (2006).

Judge, John A. et al., "Effects of Disorder in One-and Two-Dimensional Micromechanical Resonator Arrays for Filtering", Journal of Sound and Vibration, vol. 290, pp. 1119-1140, (Jul. 25, 2005).

Weinstein, Dana et al., "Mechanical Coupling of 2D Resonator Arrays for MEMS Filter Applications", IEEE, pp. 1362-1365, (2007).

Wong, Ark-Chew et al., "Micromechanical Mixer-Filters ("Mixlers")", Journal of Microelectromechanical Systems, vol. 13, No. 1, pp. 100-112, (Feb. 2004).

Li, Sheng-Shian et al., "Bridged Micromechanical Filters", 2004 IEEE International Ultrasonics, Ferroelectrics and Frequency Control Joint 50th Anniversary Conference, Aug. 24-27, 2004, pp. 280-286, (2004).

Li, Sheng-Shian et al., "Disk-Array Design For Suppression of Unwanted Modes in Micromechanical Composite-Array Filters", Tech. Dig., 19th IEEE Int. MEMS Conf. 2006, Istanbul, Turkey, pp. 866-869, (Jan. 2006).

Demirci, Mustafa U., et al., "Mechanically Corner-Coupled Square Microresonator Array for Reduced Series Motional Resistance", Journal of Microelectromechanical Systems, vol. 15, No. 6, pp. 1419-1436, (Dec. 2006).

Demirci, Mustafa U., et al., "A Low Impedance VHF Micromechanical Filter Using Coupled-Array Composite Resonators", Tech. Dig., 13th Int. Conf. Solid-State Sensors & Actuators, pp. 1419-1436, (2005).

Demartini, Barry E., et al., "A Single Input-Single Output Mass Sensor Based on a Coupled Array of Microresonators", Sensors and Actuators A, vol. 137, pp. 147-156, (Feb. 17, 2007).

Galayko, Dimitri et al., "Microelectromechanical Variable-Bandwidth If Frequency Filters With Tunable Electrostatical Coupling Spring", IEEE, pp. 153-156, (2003).

Pourkamali, Siavash et al., "Electrically Coupled MEMS Bandpass Filters Part I: With Coupling Element", Sensors and Actuators A, vol. 122, pp. 307-316, (May 3, 2005).

Alastalo, Ari T., et al., "Intermodulation in Capacitively Coupled Microelectromechanical Filters", IEEE Electron Device Letters, vol. 26, No. 5, pp. 289-291, (May 2005).

International Search Report issued Jul. 21, 2009 in PCT/EP09/054100 filed Apr. 6, 2009.

* cited by examiner

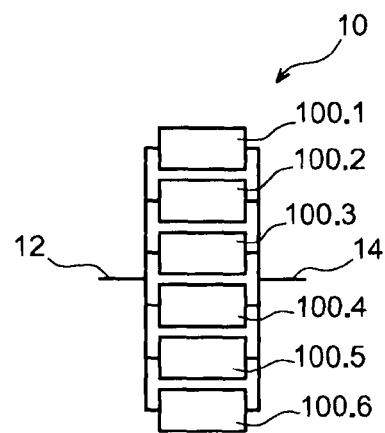
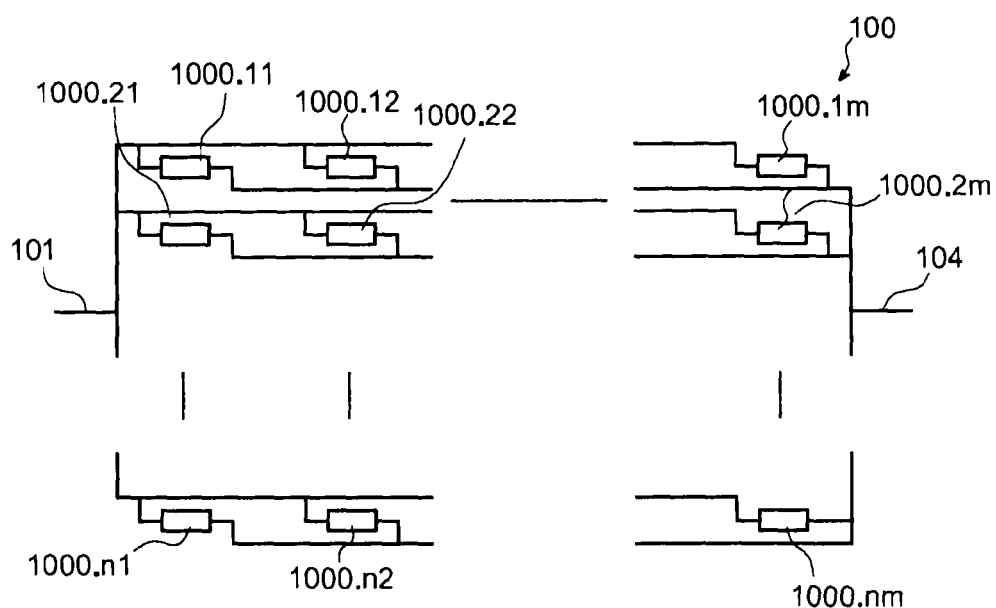

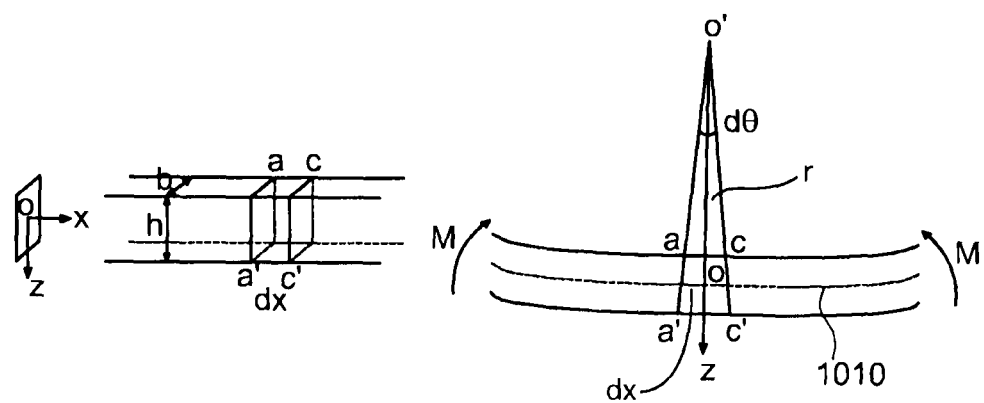
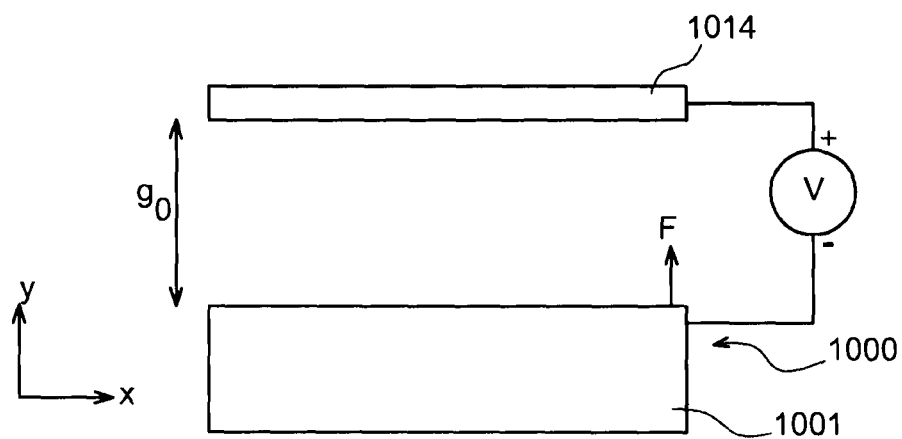
FIG. 8
FIG. 9

RESONANT FILTER BASED ON AN N/MEMS MATRIX

TECHNICAL FIELD

The invention concerns a resonant filter that can for example be used as a RF (Radio Frequency) filter.

The invention is particularly applicable to the telecommunications field.

BACKGROUND OF THE INVENTION

It is known to make resonant filters from acoustic resonators of the SAW (surface acoustic waves) or QCR (quartz crystal resonator) type. The main drawback of these resonators is their relatively large size. There are also miniaturized resonators of the FBAR (film bulk acoustic resonators) or BAW (bulk acoustic wave resonators) type smaller than the SAW or QCR resonators. However, such resonators are still bulky, in particular due to their support membranes, and are also difficult to manufacture.

To resolve this bulk problem, it is possible to produce RF filters from resonators of the MEMS (micro-electro-mechanical systems) type having a reduced bulk and low consumption. In addition, these resonators make it possible to obtain high resonance frequencies and very high quality factors, and are easy to produce. Such resonators can also be integrated with the electronic processing part of the filter on a same chip.

It is known to mechanically couple several MEMS resonators in order to implement signal processing functions able to be carried out by transistor circuits, but with more power and better linearity. These coupled resonators make it possible to obtain different types of filtering on a broader bandwidth than that obtained by an individual resonator. However, the responses obtained by coupled resonators depend greatly on individual parameters of the resonators used and their operating states. Depending on the aim of the application, the number of resonators used varies and the coupling elements are modified.

The mechanical coupling of MEMS resonators has several drawbacks, and in particular the dispersion of the parameters of the resonators due to the hazards of the mass production of resonators, leading to poor knowledge of the global system, as well as the difficulty of integrating it due to its larger size. Although using NEMS (nano-electro-mechanical systems) reduces the size of the filter, it demonstrates still more problems due to the complexity of modeling couplings of a large number of resonators on the nanoscopic scale, revealing unexpected responses from the system at higher resonance modes. Furthermore, the NEMS provide output signals with lower amplitudes than those obtained by MEMS resonators, which is a major problem in the presence of electronic noise, transmissions, etc.

Furthermore, such resonator couplings have drawbacks related to the non-linearity and discontinuities in the phase of the response. Lastly, one problem that is very present in controlling such systems is the variation of their parameters with their operating states and the ambient environment, which generally reduces the performance of the associated electronic circuit.

The document J. R. CLARK et al., "Parallel-Coupled Square-Resonator Micromechanical Filter Arrays", Proceedings of the 2006 IEEE International Frequency Control Symposium, pages 485 to 490, describes the production of a filter from mechanically coupled MEMS resonators. Resonators connected in a series make it possible to decrease the series resistance of the system representing the damping. The MEMS resonators are also connected in parallel by coupling beams having a lower stiffness to increase the system's bandwidth.

In order to meet more demanding filtering characteristics or perform more sophisticated functions, it may be necessary to couple a larger number of resonators (hundreds or thousands of resonators). This greatly complicates the manufacture of such a system and the parameters of the resonators are then more dispersed and uncertain. Subsequently, the necessary coupling elements may be poorly calculated and the resonant frequencies as well as the bandwidths obtained are then poorly defined and the responses obtained end up being erroneous in relation to the desired responses. Other problems also arise, such as the noise caused by heat fluctuations, electronic noise, and gaps in the power management. Furthermore, the gains in the responses obtained are low and the global phase of the response obtained cannot be exploited due to its significant distortion. Added to these problems is the environment factor, which modifies the quality factors of the resonators and makes the electronic processing and control part much lower performing in relation to the case of nominal operation.

The document "Design considerations for an acoustic MEMS filter" by S.-H. Shen, Microsystem Technologies 10, pages 585-591, 2004, describes a device using MEMS resonators to process acoustic signals. This device includes an electronic processing circuit making it possible to couple the outlets of the circuits detecting the resonance of different MEMS resonators in order to obtain a desired bandwidth.

Such a device does, however, involve the use of imposing and bulky processing electronics to make the switches necessary for coupling the outlets of the detection circuits of the resonators. Moreover, the dispersion in the obtained results, due to the uncertainties related to the method for making the resonators, is not taken into account and the global response obtained may be distant from that which should theoretically be obtained. Lastly, in this device, detection circuits perform the vibration-electrical signal conversion for each resonator. These detection circuits comprise complex processing electronics and are therefore costly to produce given the number of resonators used.

BRIEF DESCRIPTION OF THE INVENTION

One aim of the present invention is to propose a resonant filter making it possible to at least partially resolve the problems of the prior art and obtain high performance in terms of filtering, gain, selectivity or broadening of the bandwidth, and ease of reading and control.

The invention also aims to provide a resonant filter that is not bulky and that is inexpensive to produce.

To that end, the invention proposes a resonant filter comprising a matrix of n×m resonators of the N/MEMS type, i.e. of the NEMS or MEMS type, with substantially similar dimensions and distributed in n rows and m columns, with n and m being integers strictly greater than 1. This filter includes, for each resonator:
 actuating means able to excite the resonator by controlling an electrical input signal of the filter,
 means for detecting movements of the resonator able to deliver an electrical output signal whereof the value depends on the detected movements.

An input of the filter, intended to receive an electrical input signal of the filter, is electrically connected to the actuating means of all of the resonators, the outputs of the detecting means of all of the resonators being electrically connected to each other and to a filter output.

Thus, the invention exploits a specific nature of the N/MEMS, i.e. the possibility of massively integrating a large number of resonators on a same substrate, and that positively exploits the dispersions between the resonators in a same manner, and/or of different matrices, to perform filtering functions.

Although the resonators are made such that their dimensions are substantially similar, dispersions, due to uncertainties related to the production method of the resonators, may be present and the resonators may therefore not be exactly the same size. The resonators, although made with similar nominal dimensions, therefore do not have exactly similar dimensions.

The electrical signal intended to be obtained as output of the filter is an image of the sum of the mechanical responses of the set of resonators of each matrix. Thus, given the plurality of resonators used, the average of the global response obtained as output of the filter tends toward the expected value of the individual response from a resonator. It is therefore possible to produce a filter whereof the response can be very precisely characterized.

Such a matrix precisely exploits the control of the frequency dispersion of the individual resonators so as to obtain the desired template of the filter as a function of the targeted applications. Contrary to the known devices, the matrix takes advantage of this dispersion.

Such a filter may be used to precisely compare frequencies or generate frequencies in a narrow bandwidth, for example in the microwave region, or select signals located in a certain frequency range. With such a filter, the global resonant structure can be described by a single output that is the output of the filter.

It can in particular be used in RF subsystems such as phase shifters, impedance matching networks, configurable antennas, variable filters. In telecommunications, for example, this filter can be used in heterodyne or direct conversion transmission/receiving systems. It can be used as a channel selector to reduce interference from other channels or as a reject filter of the image signals that appear directly in the IF (Intermediate Frequency) band upstream of the frequency converters, or to eliminate higher order harmonics generated by the non-linearities due to the electronic circuit. Other applications, such as frequency control systems and clocks, can also use such a selective resonant filter.

Given the structure of the filter, which can be made entirely on a single substrate, its bulk is considerably reduced, as it does not require complex electronics for processing the signals obtained as output from the means for detecting movements of the resonators, which also reduces the cost thereof.

The resonators may not be mechanically coupled to each other, i.e. be mechanically uncoupled from each other. Thus, good dispersion of the characteristics of the resonators can be ensured. The mechanical uncoupling between the resonators means in particular that from a mechanical point of view (movements), the resonators do not interact with each other.

The matrix may include a number of resonators such that the average of the global response obtained as output tends toward the expected value of the individual response from a resonator.

The resonant filter may include at least one matrix of n×m resonators of the N/MEMS type whereof the dimensions are statistically distributed around average values, for example substantially similar.

The matrix may also include a number of resonators such that the frequency response of the matrix (or the frequency response of each matrix when the filter includes several matrices) has a distribution law of the pulses corresponding to the distribution law of the technological dispersions of the resonators. Thus, there is a sufficient number of resonators in a matrix to be able to use the technological dispersion of the resonators of that matrix.

The frequency response of such a matrix including the resonators may be precisely known and have little dispersion.

The resonators may be of the beam type, said dimensions of the resonators being able to correspond to the lengths of the beams. The mechanical structures of the N/MEMS resonators of the filter may be of the embedded-free beam (i.e. having one free end and one embedded end), embedded-embedded beam (i.e. having two embedded ends), membrane, plate, disc, or other type. The deformations of said resonators may be flexional, volume extension, rotational, or translational deformations.

One particular embodiment also concerns a resonant filter including at least two matrices of n×m resonators of the N/MEMS type distributed in n rows and m columns, with n and m being integers strictly greater than 1. This filter may include, for each resonator:

actuating means able to excite the resonator by controlling an input electric signal of the filter, means for detecting movements of the resonator able to deliver an electrical output signal whereof the value is proportional to the detected movements.

The dimensions of the resonators of each of the matrices may be substantially similar to each other, and the dimensions of the resonators of one of the two matrices may be different from the dimensions of the resonators of the other of the two matrices.

The filter may include at least two matrices having different frequency responses.

The filter may include several matrices, each matrix having a different frequency response. The dimensions of the resonators of a matrix may be different from the dimensions of the resonators of another matrix.

An input of the filter, intended to receive an electrical input signal of the filter, may be electrically connected to the actuating means of the resonators of the two matrices, the outputs of the detecting means of the resonators of the two matrices being able to be electrically connected to each other and to an output of the filter.

When resonators of two matrices are actuated by a same electrical input signal of the filter, detecting means of the resonators of one of the matrices may be able to deliver electrical signals of values opposite the electrical signal values intended to be delivered by resonator detecting means of the other of the matrices.

The signal obtained as output of the filter can therefore be of the differential type.

The difference between the dimensions of the resonators of one of the two matrices and the dimensions of the resonators of the other of the two matrices may be between about 1% and 50%.

When the mechanical structures of the resonators are of the beam type, the different dimensions between the mechanical structures of the resonators of the two matrices may be the lengths of the beams.

The actuating means of at least part of the resonators may be of the electrostatic type.

In this case, electrostatic-type actuating means of a resonator may include a first electrode formed by at least part of the mechanical structure of the resonator composed of an electrically conductive material and a second electrode spaced away from the first electrode, a control voltage being able to be intended to be applied between the two electrodes.

It is possible for the second electrodes of the electrostatic-type actuating means of the resonators to be formed by a single electrode shared by the resonators of the matrix or of several matrices of the filter. Thus, by using actuating means shared by all of the resonators of the filter, a homogenous force can be applied on all of the resonators.

The second electrode of the actuating means may be shared by all of the resonators of the matrix.

The detecting means of at least part of the resonators may be of the capacitive type.

In this case, the capacitive-type detecting means of a resonator may include capacity measuring means between an electrically conductive portion of the resonator and an electrode spaced away from said electrically conductive portion.

Generally, the number of N/MEMS resonators used in the filter will depend on the considered application, the desired response, and other constraints such as the size of the resonators or the dimensions of the chip on which the filter is produced. A matrix may include between about 50 resonators and 10,000 resonators, or between 1,000 resonators and 10,000 resonators, or between 2,000 resonators and 5,000 resonators, or at least 50 resonators, or at least 1,000 resonators. The matrix may for example include about 4,800 resonators distributed in 240 columns and 20 rows. The arrangement of the resonators, i.e. the number of rows and columns of the matrix, may in particular depend on the dimensions of the substrate on which the filter is made.

The electrical connections present on a matrix may be formed by a layer composed of a conductive material connecting the outputs of the detecting means of the resonators to each other.

The filter may include a plurality of matrices of resonators of the N/MEMS type electrically connected and parallel to each other, in which detecting means of the resonators of one part of the matrices may be able to deliver electrical signals of values opposite the electrical signal values intended to be delivered by resonator detecting means of another part of the matrices.

The filter may include a plurality of matrices of N/MEMS-type resonators electrically connected and parallel to each other such that the electrical signal intended to be obtained as output of the filter corresponds to the sum of the electrical signals obtained as output of each matrix.

The resonators of all of the matrices may have substantially similar dimensions.

Detecting means of the resonators of at least one of the matrices may be able to deliver electrical signals with values opposite the electrical signal values intended to be delivered by detecting means of the resonators of at least one of the other matrices. The signal intended to be obtained as output of the filter may be of the differential type.

Detecting means of the resonators of a number of matrices corresponding to half the total number of matrices of the filter may be able to deliver electrical signals of values opposite the electrical signal values intended to be delivered by detecting means of the resonators of a number of matrices corresponding to half the total number of matrices of the filter. The signal intended to be obtained as output of the filter may be of the differential type.

The dimensions of the resonators of matrices able to deliver said electrical signals having opposite values may be different from the dimensions of the resonators of the other matrices. The difference between the dimensions of the resonators of matrices able to deliver said electrical signals having opposite values and the dimensions of the resonators of the other matrices may be between about 1% and 50% of the value of one of said dimensions.

Said filter may be made on a single substrate, thereby contributing to resolving the bulk problems existing in the prior art.

The feature according to which the matrices are electrically connected to each other and parallel to each other can mean that the inputs of each matrix, which are electrically connected to the actuating means of the resonators of each matrix, may all be electrically connected to the input of the filter, and that the outputs of each matrix, which are electrically connected to the outputs of the detecting means of the resonators of each matrix, may all be electrically connected to the output of the filter.

The matrices may be electrically connected to each other by microminiature circuitry.

The invention also concerns a method for producing a resonant filter as previously described, wherein the resonators are produced by etching in a layer composed of a conductive material arranged on a semiconductor substrate, the remaining portions of the conductive layer after the etching step forming the electrical couplings of the filter.

The invention also concerns a resonant structure including several resonant filters as described above electrically connected to each other in series.

BRIEF DESCRIPTION OF THE DRAWINGS

The present invention will be better understood upon reading the description of embodiments provided purely for information and non-limitingly in reference to the appended drawings, in which:

FIG. 1 shows an example of a resonant filter according to one particular embodiment, including several matrices of resonators;

FIG. 2 diagrammatically illustrates an example of a matrix used in a resonant filter according to one particular embodiment, from the detecting perspective;

FIG. 8 diagrammatically illustrates the deflection and elongation of the beam of a resonator used in a resonant filter as a function of a radius of curvature r;

FIG. 9 shows an example of a resonator used in a resonant filter associated with electrostatic-type actuating means;

Figure 3:
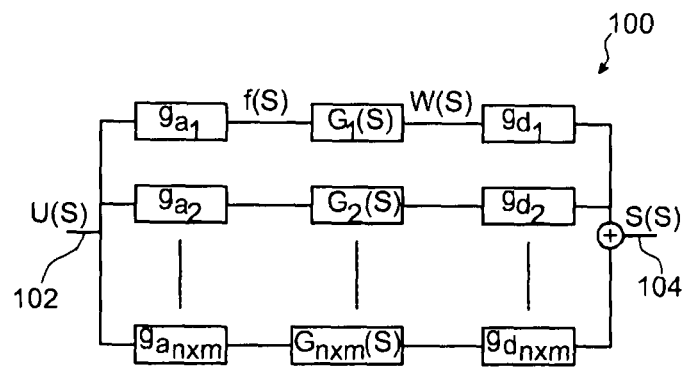
FIG. 3 is a functional diagram of a matrix of a resonant filter according to one particular embodiment.

Identical, similar or equivalent parts of the different figures described below bear the same numerical references so as to facilitate the transition from one figure to the next.

The different parts shown in the figures are not necessarily shown using a uniform scale, to make the figures more legible.

The different possibilities (alternatives and embodiments) must be understood as not being mutually exclusive and can be combined with each other.

DETAILED DESCRIPTION OF SPECIFIC EMBODIMENTS

We will first refer to FIG. 1, which illustrates a resonant filter 10 according to one particular embodiment.

The resonant filter 10 includes six matrices 100.1 to 100.6 of N/MEMS resonators electrically coupled to each other in parallel. In FIG. 1, these matrices 100.1 to 100.6 are electrically coupled to each other in parallel. In one alternative, the matrices 100.1 to 100.6 may be electrically connected to each other in a different way, i.e. include series- and/or parallel-type connections between the matrices.

The inputs of each matrix 100.1 to 100.6 are connected to an input 12 of the resonant filter 10 on which an electrical input signal is applied, corresponding to the signal to be filtered, the outputs of these matrices being connected to an output 14 of the filter 10. In this embodiment, the resonators of the matrices 100.1 to 100.6 are of the NEMS type. However, the principles stated in this description also apply to resonators of the MEMS type. The structures of the matrices 100.1 to 100.6 and of the resonators of those matrices will be detailed later.

All of the NEMS resonators of the matrices 100.1 to 100.6 form a resonant structure subjected to a same pulse excitation force $\omega_e$, corresponding to the input signal to be filtered applied on the input 12 of the filter 10. This excitation force is applied to the resonators by actuating means. This excitation force causes oscillating movement amplitudes of the different resonators depending on the transfer functions of each of the matrices. Detecting means make it possible to deliver an electrical output signal as a function of the detected movements of the resonators.

We will now refer to FIG. 2, which diagrammatically illustrates an example of a matrix 100 of NEMS resonators used in the resonating filter 10, illustrated from the perspective of detecting movements of the resonators of the matrix.

In such a matrix 100, NEMS resonators 1000 are for example made in a layer composed of a conductive material, for example a metal such as aluminum, initially deposited on a semiconductor layer, for example composed of silicon. The conductive layer, and possibly the semiconductor layer, are etched so as to form the different NEMS resonators 1000, as well as the electrical connections between the resonators 1000 diagrammatically illustrated in FIG. 2. The conductive layer, and possibly the semiconductor layer, therefore form a shared conductor support making it possible to electrically couple and interconnect the resonators 1000 to each other.

The matrix 100, and more generally the resonant filter 10, may be made from a structure of layers different from that described above and/or composed of different materials (for example a SOI substrate, ... ).

The resonators 1000 are made so as to form a matrix of n×m NEMS resonators 1000 distributed in n rows and m columns, n and m being integers greater than 1. In FIG. 2, the resonators 1000.11 to 1000.n1 form the first column of the matrix 100, the resonators 1000.12 to 1000.n2 form the second column of the matrix 100, and so on up to resonators 1000.1m to 1000.nm forming the $m^{th}$ and final column of the matrix 100. The resonators are placed far enough away from each other, for example by a distance at least equal to the dimensions of a resonator, to avoid any mechanical coupling.

The matrix 100 also includes a first input 102, not shown in FIG. 2, on which is applied the electrical input signal located on the input 12 of the resonant filter 10, in the form of a voltage or current. This signal is sent as input of the actuating means of all of the resonators 1000.11 to 1000.nm of the matrix 100 in order to apply a pulse excitation force $\omega_e$, corresponding to the frequency of the input signal to be filtered, to the resonators.

The matrix 100 also includes a second input 101, on which a second electrical signal is applied. This second electrical signal is applied as input of the resonators 1000.11 to 1000.nm. The outputs of all of the resonators 1000.11 to 1000.nm, i.e. the outputs of the detecting means of all of the resonators, are electrically connected to each other, which makes it possible to obtain, on an output 104 of the matrix 100, a signal representing the sum of the mechanical responses of the resonators. The amplitude of the signal obtained as output will therefore depend on the second electrical signal applied on the input 101. The manner in which the resonators and the detecting means are electrically connected to each other in FIG. 2 is only one example embodiment and these connections could be done differently (outputs of the detecting means connected to each other in series and/or in parallel and/or some in series and others in parallel).

In one alternative, it is possible for the first and second signals to be one same signal including two distinct components, one being used for detecting and the other for actuating.

FIG. 3 illustrates a functional block diagram of the matrix 100. In this diagram, the matrix 100 is shown in the form of N systems connected in parallel, each system representing a resonator associated with actuating means and detecting means. Each system i includes a first block $g_{ai}$, a second block $G_i(s)$ and a third block $g_{di}$, with i such that $1 \le i \le n \times m$. A signal U(s) represents the signal, for example a voltage, applied on the input 102 of the matrix 100, and a signal S(s) represents the signal, for example a voltage, recovered on the output 104 of the matrix 100.

The blocks of each system represent the transfer function of each system of the matrix 100. The block $g_{ai}$ represents the gain contributed by the actuating means of the resonator i. A signal $f(s)=g_{ai}.U(s)$ is therefore applied as input of the block $G_i(s)$ representing the transfer function of the resonator i of the matrix 100. A signal $w(s)=G_i(s).f(s)$ is therefore applied as input between the block $g_{di}$ representing the gain of the detecting means used to detect the signal obtained as output of the resonator i. The signal S(s) is then recovered on the output 104 of the matrix 100, S(s) being the sum of the signals obtained as output of the blocks $g_{di}$ of the n×m systems.

There is therefore, for example, an electrical input signal, current or voltage, corresponding to a signal to be filtered that is applied to the input terminals of all of the systems of the matrix 100. This electrical input signal is then applied to all of the actuating means of the resonators. The resonators are excited in a manner controlled via the actuating means. A detection of the movements of the resonators is done, these movements being converted into electrical output signals by the detecting means. Lastly, these electrical output signals are added by electrical connection to yield a single electrical output signal corresponding to the signal filtered by the matrix 100.

Figure 4:
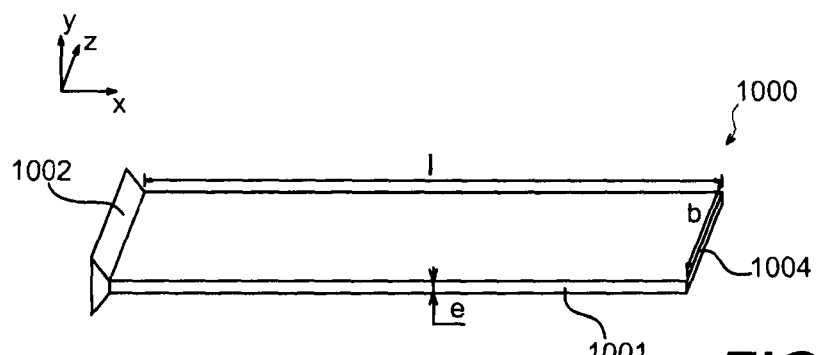
FIG. 4 shows an example of a resonator used in a resonant filter, object of the present invention, according to one particular embodiment.

One example of a NEMS resonator 1000 used in the matrix 100 is illustrated in FIG. 4. The resonator 1000 is of the beam type here, this beam being of nanometric dimensions. It includes a body 1001 with substantially rectangular sections along planes (y,z) and (x,z), of length l, width b and thickness e, forming said beam. The resonator 1000 includes an embedded first end 1002 and a free second end 1004. When the resonator 1000 moves under the effect of an exciting force, the maximum vibrational movement then occurs at the free end 1004.

In one alternative, both ends 1002 and 1004 of the NEMS resonator 1000 could be embedded. In that case, when the resonator 1000 moves under the effect of an exciting force, the maximum vibrational movement occurs approximately at the middle of the length l of the body 1001. Moreover, the body 1001 of the resonator 1000 can also have a shape other than that shown in FIG. 4, and in particular sections other than rectangular ones.

The resonant filter 10 uses the natural vibration frequency of the NEMS resonators 1000 to transmit very precise frequency signals while attenuating signals and noises on other frequencies. By applying a vibrational force with a frequency defined in input, the mechanical microstructures or nanostructures of the resonators 1000 undergo a vibrational deflection or displacement at that same frequency and with amplitudes proportional to the intensity of the input signal, these amplitudes becoming significant in case of resonance (actuating or exciting frequency equal to the resonance frequency of the microstructure of the resonator 1000 itself).

The quality factor Q of a resonator 1000 is defined by the ratio of the resonance frequency of the resonator over the width of its bandwidth (which is defined by the frequencies where the amplitudes are equal to half that corresponding to the resonance peaking of the resonator) and depends in particular on the damping due to the viscosity of the fluid or gas surrounding the mechanical structure of the resonator, as well as mechanical parameters of the resonator (mass, rigidity of the material used, . . . ). The selectivity of a resonating filter is proportional to the quality factors of the resonators used. But the detection interval of the frequencies decreases when the quality factor increases, and the bandwidth is therefore narrower when a resonator with a high quality factor is used.

The response of one of the resonators 1000 is characterized by its transfer function corresponding to the ratio of the amplitude of the mechanical displacement of the resonator in relation to the force applied as input of the resonator at the operating frequencies. This input force generally results from the application of an electrical voltage to the terminals of actuating means of the mechanical structure of the resonator. The detected output, i.e. the displacement of the mechanical structure of the resonator, can then be electrically converted using detecting means.

Generally, the resonators 1000 used in the matrix 100 can also be of a type other than a beam, for example a disc.

The dynamic behavior of the transverse movement w(x,t) of said resonator 1000 subjected to a distributed lineic force f(x,t) is described by the following relationship:

$$EI\frac{\partial^4 w(x,t)}{\partial x^4} + c\frac{\partial w(x,t)}{\partial t} + \rho S\frac{\partial^2 w(x,t)}{\partial t^2} = f(x,t) \tag{1}$$

where E is Young's modulus of the resonator, $I=be^3/12$ the moment of inertia of the resonator, $S=b\cdot e$ the transverse section of the body 1001 (section along plane (y,z)), ρ the density of the material of the resonator and c the damping coefficient of the material of the resonator.

Following the Galerkin modal decomposition procedure, one obtains:

$$w(x,t) = \sum_{k=1}^{n} a_k(t) \cdot w_k(x) \tag{2}$$

such that $\partial^4 w_k(x)/\partial x^4 = \lambda_k^4 w_k(x)$, with $a_k(t)$: dynamic coefficient associated with the k-th resonance mode;

$\lambda_k$: value of the operator $\partial/a\partial$;

$w_k(x)$: transverse displacement associated with the k-th resonance mode.

By limiting oneself to the $1^{st}$ resonance mode $w_1(x)$, the displacement on the y axis (shown in FIG. 4) of the resonator 1000 is described by the relationship:

$$w(x,t) = a(t) \cdot w_1(x) \tag{3}$$

In the case of a resonator including a free end as in FIG. 4, one finds $\lambda_1=1.8751/l$, and $\lambda_1=4.73/l$ when both ends of the resonator 1000 are embedded.

Figure 5:
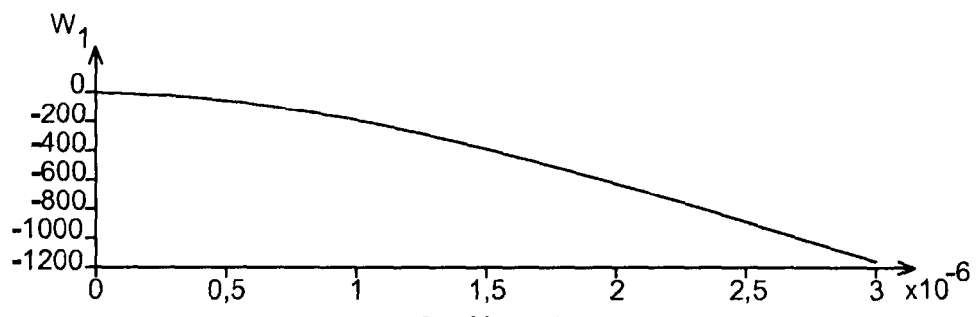
FIGS. 5 and 6 graphically show values of the movement along an axis y associated with the first resonance mode of a beam-type resonator including only one and two embedded ends, respectively, used in a resonant filter as a function of the position on an axis x.
Figure 6:
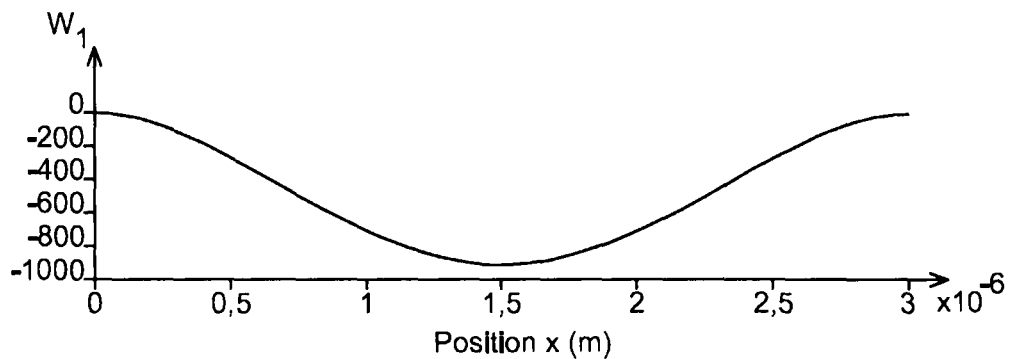

FIG. 5 graphically illustrates the value of $w_1(x)$ as a function of the position on the axis x, for a body 1001 with a length equal to 3 μm. FIG. 6 graphically illustrates that same value of $w_1(x)$, in the case of a resonator having both ends embedded. The curves shown in these two figures therefore illustrate the profile of these two types of beam in the plane (x,y) along the axes x and y shown in FIG. 4, during a resonance.

Considering equation (1) applied to the first resonance mode, the following dynamic equation of the coefficient a(t) is obtained:

$$EI\lambda_1^4 \cdot a(t) + c\cdot\dot{a}(t) + \rho S \ddot{a}(t) = f(t) \tag{4}$$

One then obtains, from equation (4), the following transfer equation:

$$\frac{a(s)}{f(s)} = G(s) = \frac{1/m}{s^2 + \frac{\omega_0}{Q}s + \omega_0^2} \tag{5}$$

with $$m = \rho \cdot S, \; k = E \cdot I \cdot \lambda_1^4, \; \omega_0 = \sqrt{\frac{k}{m}} \; \text{and} \; Q = \frac{\omega_0 \cdot m}{c}.$$

Figure 7:
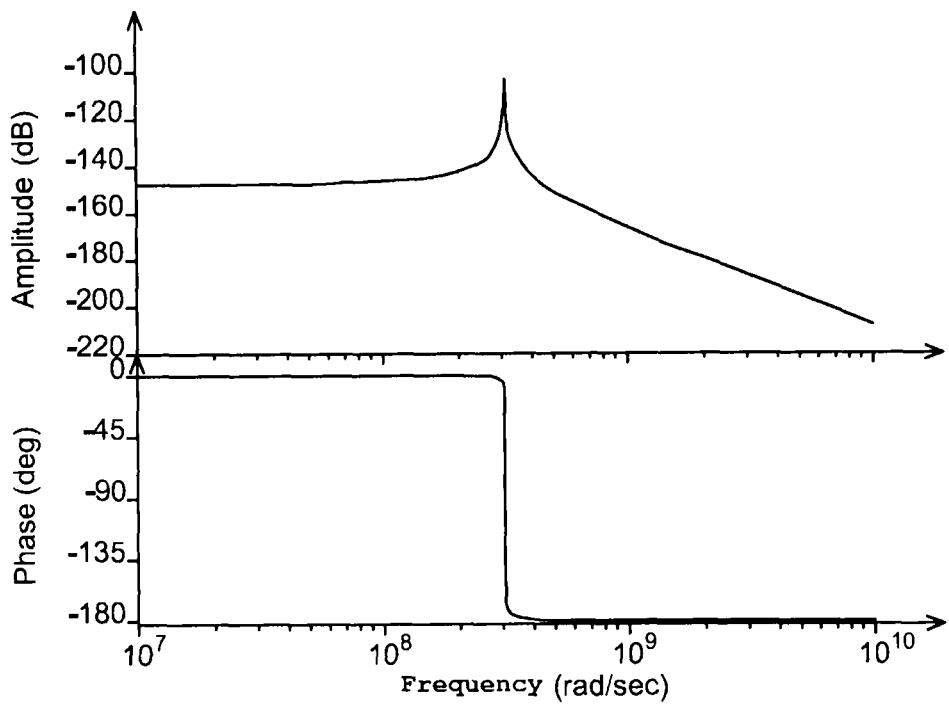
FIG. 7 illustrates a Bode diagram of the transfer function of a beam-type resonator used in the resonant filter next to a model of the second order.

FIG. 7 shows the Bode diagram of this transfer function, corresponding to the individual response in frequencies of the resonator 1000, here next to a model of the second order. This FIG. 7 shows that a relatively narrow peak is obtained at the resonance, indicating a high quality factor of the resonator, which is particularly applicable for the production of the filter 10.

FIG. 8 diagrammatically illustrates the deflection and elongation of the beam of the resonator 1000 as a function of a radius of curvature r.

For a flexion resulting from the elongation of the resonator following an actuation, we have, on a neutral line 1010 that does not undergo elongation:

$dx = r \cdot d\theta$ where $r$ is the radius of curvature.

At the transverse section of the body 1001 of the resonator 1000, we also have:

$dx_s = (r + h/2) \cdot d\theta$.

The difference $(dx - dx_s)$ expresses the elongation undergone by the body 1001 and is expressed by the following equation:

$d(\delta l) = h/2 \cdot d\theta$, which subsequently makes it possible to write that:

$$\delta l = \int_{\theta_1}^{\theta_2} \frac{h}{2} d\theta = \frac{h}{2} \int_0^{l_1} \frac{1}{r} dx \text{ with}$$

$$\frac{1}{r} = \left| \frac{d^2 w(x,t)}{dx^2} \right| = w''(x) \cdot a(t)$$

We therefore see that $\delta l$ is proportional to $a(t)$ and therefore proportional to the displacement on any x-axis whatsoever defined by the body 1001 of the resonator 1000.

The resonators 1000 used by the resonating filter 10 can be actuated by different types of linear actuating means, the force produced being proportional to the electrical control signal.

One example of a resonator 1000 associated with electrostatic-type actuating means will now be described in relation to FIG. 9.

This actuating means includes a first electrode 1014. The body 1001 of the resonator 1000, which is composed of a metal material, forms a second electrode. A voltage V, for example corresponding to the voltage applied in input of the resonant filter 10, is applied between the electrode 1014 and the body 1001. This voltage V generates an electrostatic force proportional to the square of said voltage and inversely proportional to the distance separating the electrodes, i.e. ($g_0 - w$), $g_0$ being the initial distance between the body 1001 and the electrode 1014 when the resonator 1000 is idle, w being the displacement distance of the body 1001 in relation to its initial position when the latter is subjected to the electrostatic force. This electrostatic force can create a lateral displacement of the body 1001 in the plane of the body 1001 or a vertical displacement outside the plane, depending on the location of the actuating electrode.

The attractive force F undergone by the body 1001, illustrated by an arrow along the axis y of FIG. 9, can be expressed by the equation:

$$F = \frac{1}{2} \frac{\varepsilon_0 \cdot S \cdot V^2}{(g_0 - w)^2}$$

with $\varepsilon_0$ vacuum permittivity.

An oscillating electrostatic force with a frequency $\omega_e$, causes a vibrational movement of the structure, i.e. of the body 1001, at the same frequency and whereof the amplitudes depend on the transfer function of the resonator 1000. Considering a small displacement w, the electrostatic force F is then expressed by:

$$F = \frac{1}{2} \frac{\varepsilon_0 \cdot S \cdot V^2}{g_0^2} + \frac{\varepsilon_0 \cdot S \cdot V^2}{g_0^3} \cdot w$$

The dynamic behavior of the displacement of the body 1001 of the resonator 1000 with regard to the input $V^2$ is described by $g_a \cdot G'(s)$ such that $G'(s)$ is different from $G(s)$, transfer function of the resonator 1000, by a slight shift of the resonance frequency and the quality factor due to the non-linear electrostatic effect, $g_a$ being the gain of the actuating means of the resonator 1000.

Different types of vibration detections of the resonators are also compatible to produce the resonant filter 10 and make it possible, by electrical connection of the different NEMS resonators and without using electronic processing components, to take advantage of the collective response of the resonators of a same matrix but also of that of different matrices connected to each other in parallel, by summation of their responses for a unique reading of the global response of the resonant filter.

It is for example possible to measure the response of the resonator by performing an impedance detection (for example capacitive, resistive variation . . . ).

In reference to FIG. 9, for example, when the body 1001 of the resonator 1000 is idle and does not undergo any force or displacement, an initial capacity can be measured between the body 1001 of the resonator 1000 and the electrode 1014 that is equal to $$C_0 = \frac{\varepsilon_0 S}{g_0},$$

with S surface of one of the electrodes facing the other electrode. Following the displacement w resulting from an actuation, the distance between the electrode 1014 and the body 1001 varies and subsequently, the resulting capacity then becomes $$C = \frac{\varepsilon_0 S}{g_0 - w(x, t)}.$$

For small displacements, this capacity can also be expressed in the form:

$$C = C_0 + \delta C = C_0 + \frac{\varepsilon_0 \cdot S}{g_0^2} w$$

Taking into account the flexion of the body 1001 and therefore the distance variation along the axis x shown in FIG. 9, the electrically measured capacity variation is equal to:

$$\delta C = \frac{\varepsilon_0 \cdot b}{g_0^2} \cdot \int_0^l w(x, t) dx = \left( \frac{\varepsilon_0 \cdot b}{g_0^2} \cdot \int_0^l w_1(x) dx \right) \cdot a(t) \Rightarrow \delta C(s) = g_d \cdot G(s) \cdot f(s)$$

where $g_d$ represents the constant gain of the detecting means, the value of which depends on the initial distance $g_o$ and the dimensions of the body 1001 of the resonator 1000.

In the general case of an impedance detection, following flexion, the body 1001 undergoes an impedance variation dZ measured electrically, such that:

$$\Rightarrow \delta Z(s) = g_d \cdot G(s) \cdot f(s)$$

with $g_d$ a constant gain depending on the detection coefficient and the dimensions of the body 1001.

Each impedance variable, with $\delta Z \ll Z_0$, is equivalent to two parallel impedances with values $Z_0$ and $$\frac{-Z_0^2}{\delta Z}.$$

In calculating the equivalent impedance of the matrix, the following equation is found for the global current:

$$i = \frac{V}{mZ_0/n} - \frac{V \cdot \sum_{i=1}^{n \times m} \delta Z_i}{m^2 Z_0^2}$$

The global frequency response of the entire matrix is then defined by:

$$H(s) = \frac{\delta i(s)}{f(s)} = -\frac{V \cdot g \cdot \sum_{i=1}^{n \times m} G_i(s)}{m^2 Z_0^2}$$

In the case of detection of the capacitive type, and for low capacity variations in relation to the initial capacities, the electrical connection of the NEMS resonators also makes it possible to obtain, by a single measured output (for example the output voltage), a global response expressed by the sum of the individual frequency responses of the resonators.

In the case where the individual transfer functions G(s) of the resonators are identical, H(s) will assume the same form as G(s) but with a gain n/m times greater.

In the case where the $G_i(s)$ are dispersed and include different resonance frequencies, H(s) then includes several peaks that can be superimposed and whereof the gain spreads between $1/m^2$ and n/m, according to the dispersion. If the distribution of the $\omega_{0_i}$ is uniform in a defined interval, a final response of a nearly square band-pass filter will be obtained with a gain equal to that of the $G_i(s)$. In fact, in the case of ideal resonators ($Q \to \infty$), the frequency response of the sum of the $G_i(s)$ tends to follow exactly the distribution shape of the $\omega_{0_i}$. The latter is continuous for a continuous and non-"noisy" global response, which translates to an equivalent number N of resonators that tends toward infinity. However, it must be noted that the phase changes of the individual responses add distortions on the shape of the global gain in relation to the exact shape of the distribution and that the (finite) non-ideal quality factor "levels" these distortions as well as the discontinuities in the case of a reduced number of NEMS resonators (discontinuous distribution).

The conclusion can then be drawn that for a same dispersion of the resonance frequencies:

If Q is high, the shape of |H(s)| is more affected by the shape of the distribution of the resonance frequencies than by the individual response of the resonators. There is therefore no "leveling" effect of the quality factor, therefore N is fairly significant for a smooth global response.

If N is low, the distribution of the resonance frequencies is discontinuous and |H(s)| is therefore noisy. A lower Q will therefore "level" the shape of the global gain without changing the general appearance of the response.

Figure 10:
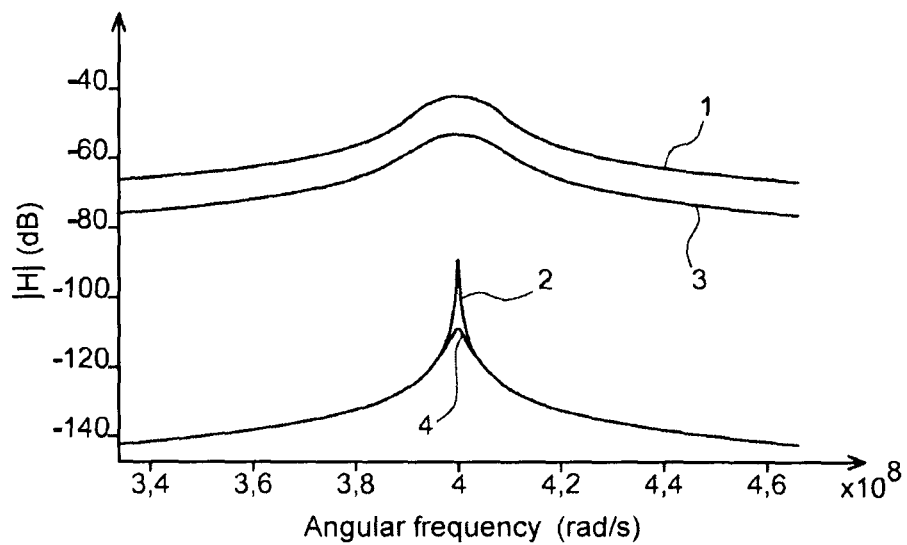
FIG. 10 shows, as an example, frequency response curves of resonant filters including, for one, 6,000 NEMS resonators with Q=1500 and for the other, 3,000 NEMS resonators with Q=150.

The resonant structure made from this type of matrix therefore makes it possible to obtain, from resonators with degraded quality factors, a response substantially similar to that obtained in the case of resonators with high quality factors, all while using a smaller number of resonators and ensuring a very high gain. This is illustrated by the curves illustrated in FIG. 10. In that figure, curves 1 and 2 illustrate the global response of a resonant filter as previously described including 6,000 NEMS resonators with Q=1500, curves 3 and 4 illustrating that of a resonating filter as previously described including 3000 NEMS resonators with Q=150. Nearly the same shape is found more affected by the dispersion than by the quality factors of the NEMS resonators.

The production of the NEMS resonators is generally subject to errors on the dimensions of the resonators, especially concerning their lengths, for example in the case of beam resonators. This dispersion can be considered Gaussian around the nominal reference length and with a standard deviation of about 10 nm (one example). This leads to dispersions in the resonance frequencies of the NEMS of a same matrix.

The relationship connecting the resonance frequency to the length of the beam is the following:

$$\omega_{0_l} = \sqrt{\frac{k_l}{m}} = \sqrt{\frac{E \cdot I \cdot \lambda_l^4}{\rho_{S_l} \cdot S}}$$

That is $$\omega_{0_l} = (1.8751)^2 \cdot e \cdot \sqrt{\frac{E}{12 \cdot \rho_{S_l}}} \cdot \frac{1}{l_l^2}$$

when the beam has one free end.

Figure 11:
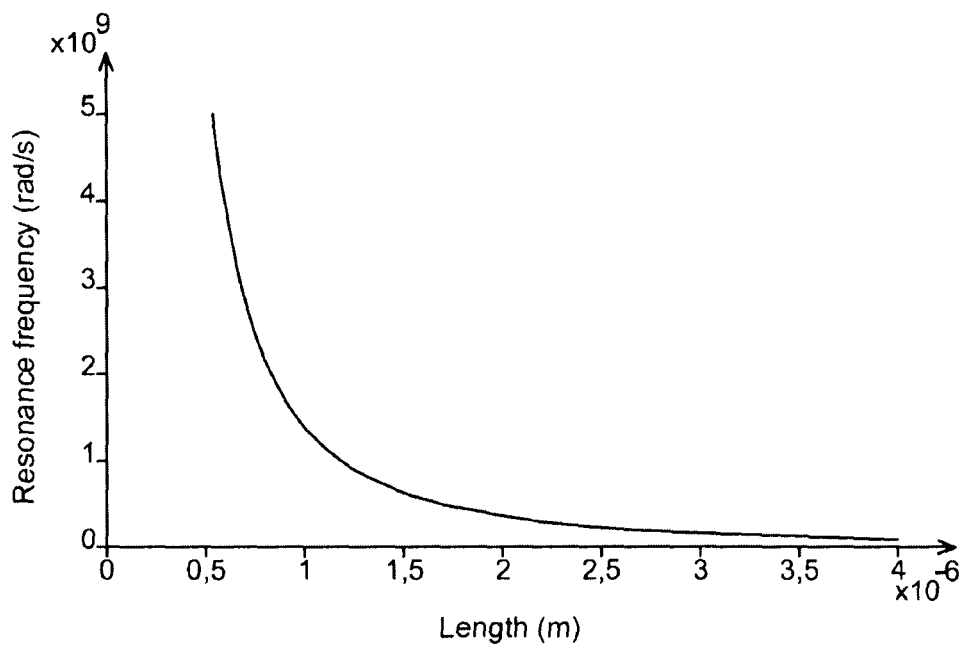
FIGS. 11 and 12 show the resonance frequency and the drift of said resonance frequency, respectively, of a NEMS resonator as a function of the length of its body in the case of a beam-type resonator.
Figure 12:
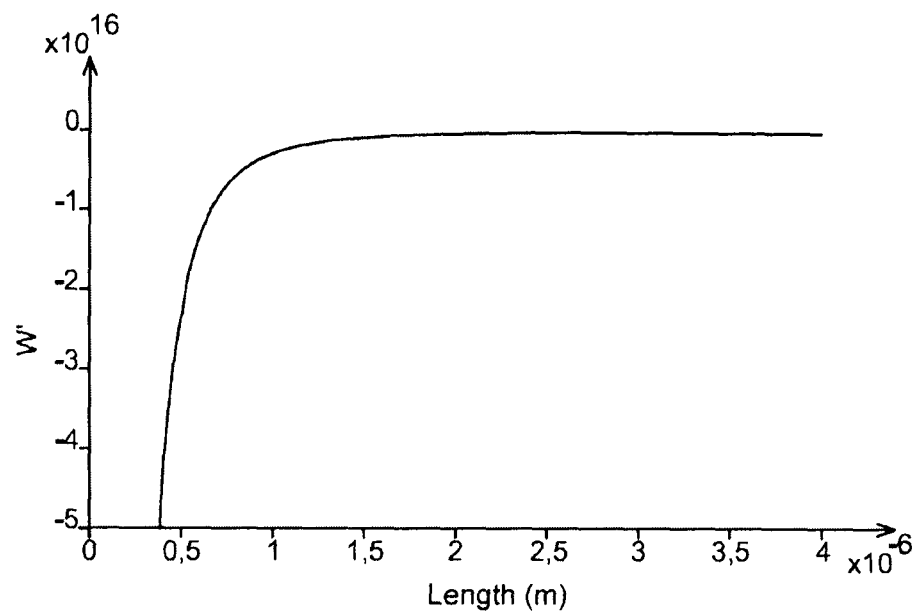

The dispersion resulting from length variations is illustrated by FIG. 11 showing, in the case of beam resonators, the resonance frequency of a NEMS resonator 1000 as a function of the length of its body 1001 and FIG. 12 illustrating the derivative of the resonance frequency of the resonator 1000 in relation to the length of its body 1001.

For a same dispersion over the lengths and in the case where said lengths are small, the corresponding resonance frequencies are high and their distribution is considered Gaussian with a nominal frequency $\omega_{0_n}$ and a significant standard deviation σ. In the case of more significant lengths, there is much less dispersion on the resonance frequencies that are also lower. The choice of lengths of the resonators to be made therefore depends on the dispersion of the desired frequencies and subsequently on the desired resulting bandwidth depending on the considered application.

As the resonance frequency of the beams defines a random variable, the global response therefore is as well. Using the statistical law of large numbers, it can be demonstrated that for a very large number N of NEMS resonators, the average of the global response, whether it is in the frequency domain or in the temporal domain, tends toward the expected value of the individual response of a resonator and with a standard deviation/average ratio inversely proportional to $\sqrt{N}$. The relative deviation between the global response of the system and its calculated theoretical average therefore becomes very small in the case of large matrices, even for significant length dispersions, which makes it possible to more precisely design a robust electronic circuit that corresponds to the filter. There is therefore an interest in producing matrices with a very large number of resonators, or even with the largest possible number of resonators.

The average of a calculated pulse response for a matrix of NEMS resonators whereof the models are approached by second orders and the distribution of their resonance frequencies by a Gaussian, is described by the following equation:

$$H(t) = N \cdot e^{-t\xi \cdot \omega_{0n} - \frac{\sigma^2}{2} \cdot t^2} \cdot \sin(\omega_{0n} t)$$

with $\xi = \frac{1}{2} \cdot Q$ which is the damping factor.

It is deduced that when $\xi \to 0$, i.e. when $Q \to \infty$, the damping is only affected by the standard deviation of the dispersion $\sigma$ whereas the global resonance frequency of the filter is equal to the average nominal resonance frequency of the distribution $\omega_{0_n}$.

Figure 13:
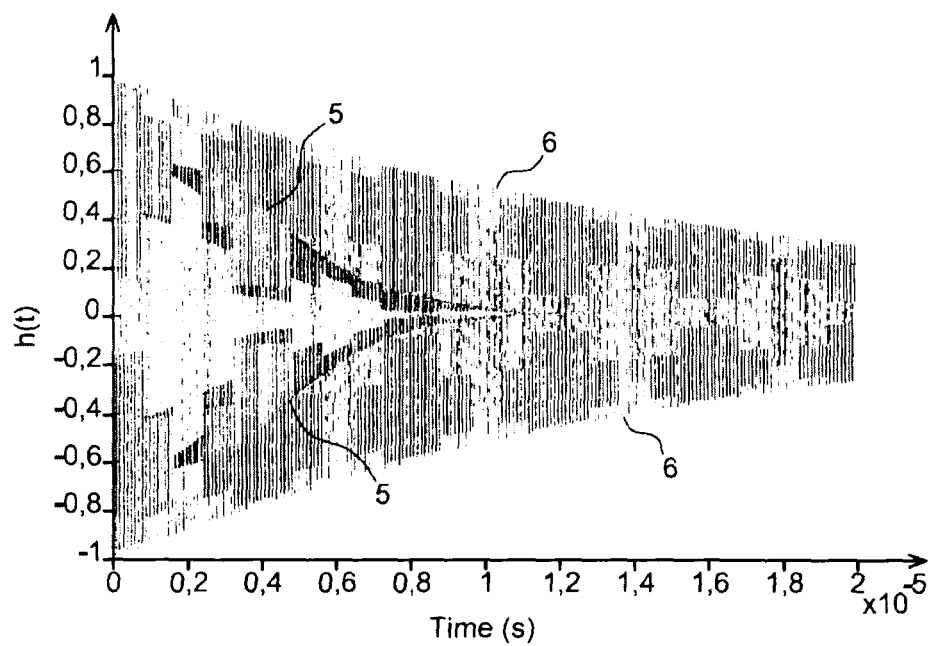
FIG. 13 illustrates a global pulse response of a resonant filter and the pulse response of a single NEMS resonator used in said resonant filter.

This is illustrated by the comparison between this global pulse response of the filter and the pulse response of a single NEMS resonator illustrated in FIG. 13. In that figure, the curves 5 define the global pulse response of the resonant filter, the curves 6 defining the individual pulse response of a single NEMS resonator of the resonant filter.

As shown in FIG. 1, several matrices 100 of NEMS resonators can be electrically connected to each other in parallel to make the resonant filter 10.

In a first example, it is possible to make the resonant filter 10 by electrically connecting the NEMS matrices 100 by microminiature circuitry. Such a resonant filter can in particular be used to make a mechanical band-pass filter for high frequencies and with a gain having a high signal/noise ratio while doing away with the problems of dispersions and complex coupling.

Such a resonant device 10 can for example be made from 6 matrices 100 connected to each other in parallel as shown in FIG. 1. Each of these 6 matrices 100 can include 4800 NEMS resonators connected in the form of 240 columns and 25 rows. Such a resonant filter can for example be used to make a filter with a large bandwidth for RF band-pass filtering and signal frequency processing applications.

For this type of application, it is possible to exploit the dispersions to widen the bandwidth of the filter as a function of the standard deviation while having a high gain (compared to a single resonator with a degraded quality factor or coupling of two or more resonators with better quality factors). Moreover, these filters are often applied to RF or very high frequency applications, resulting in the interest of making NEMS resonators with small reference sizes (nominal length), for example having a length between 0.5 µm and 2 µm, or between 0.5 µm and 1 µm, or even less than 0.5 µm, thereby ensuring high resonance frequencies with a strong dispersion, which makes it possible to obtain a wider bandwidth.

Following the filter architecture previously proposed, the resonators of each of k matrices, with for example k=6, are designed with the same nominal length and these matrices are connected to each other in parallel so that their response currents or voltages are added. Moreover, for a large enough number N of NEMS resonators, the behavior of the resonant filter and its frequency response, which depend much more on the dispersion standard deviation than on the quality factor, are then well known (the standard deviation of the global response being much lower in relation to its average than that of an individual response) and fixed (independent of the changes of the operating environment).

Figure 14:
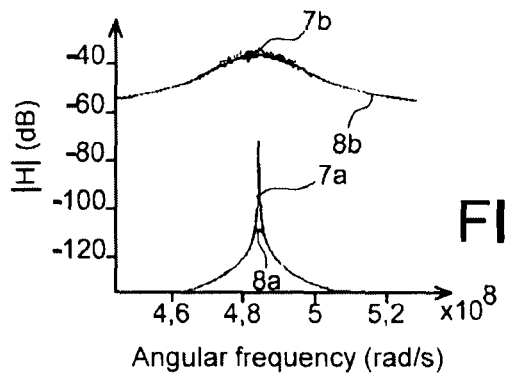
FIGS. 14 and 15 show, as an example, the frequency responses of resonant filters.
Figure 15:
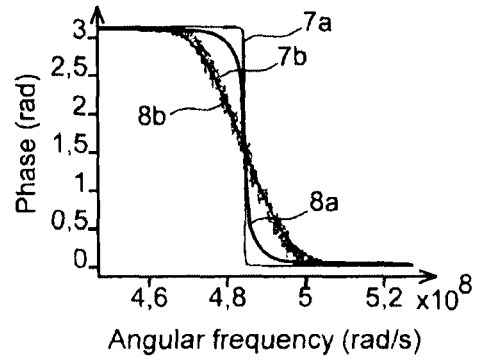

FIGS. 14 and 15 illustrate the responses obtained with a resonant filter including 6 matrices connected in parallel, each with 4800 NEMS beam resonators. The NEMS resonators of said filter have the same nominal length during manufacture, which is set at 1.69 µm. The corresponding nominal resonance frequency is 77 MHz. Curves 7b show the global response of the resonant device with a quality factor equal to 15000, curves 7a showing the response of a matrix of said resonant filter. Curves 8b show the global response of the resonant device with a quality factor equal to 300, curves 8a showing the response of a matrix of said resonant filter.

It can be seen in these FIGS. 14 and 15 that the global response is nearly identical between the two resonant filters ("noisier" for the case of Q=15000) and the amplified shape of its amplitude corresponds to the statistical distribution of the resonance frequencies of the different resonators. Moreover, the global phase spreads linearly over the entire distribution interval of the resonance frequencies.

In the case where broader bandwidths are desired, the nominal lengths of the beams of each matrix are modified and chosen such that they are offset by small intervals (20 nm for example), involving shifts of the resonance frequencies (for example 15 MHz), from each other. This makes it possible to have, for the entire filter, a uniform distribution between the two nominal resonance frequencies of the first and last block $\omega_{0_1}$ and $\omega_{0_k}$, and therefore $|H(s)|$ assumes a nearly square band-pass shape. Here again, the amplified shape of its amplitude corresponds to the statistical distribution of the resonance frequencies of the different resonators.

The resonant filter 10 can also be used to make a selective filter with a narrow bandwidth. Such a filter also offers better attenuation on the other frequencies.

In this case, the lengths of the NEMS resonators can be chosen to be relatively large, so that the corresponding resonance frequencies are less dispersed. Generally, the dimensions of the resonators (for example the lengths of the beams) may be less than about 50 µm, or between 1 µm and 10 µm, or between 2 µm and 5 µm.

The resonant filter 10 can in this case include a differential architecture formed with the six matrices of different, but very close nominal frequencies. The output of the matrices can be differentiated with the electrical components. So as not to add electronic components for the processing and differential calculation of the signals, it is possible to make detecting means that will provide, without additional electronic components, signals of opposite values. The detecting means of the NEMS resonators belonging to 3 first matrices, for example matrices 100.1, 100.2, and 100.3, can provide electrical signals with values opposite the detecting means of the other resonators belonging to the other 3 matrices, i.e. matrices 100.4, 100.5, and 100.6, and for a same excitation of the resonators. In the case of a capacitive detection, the fixed detecting electrodes are placed above the resonators of the first 3 matrices and the others are placed below the resonators of the other 3 matrices, resulting in positive capacitive variations for the first 3 matrices and negative ones for the other 3 matrices, for a same flexion. Thus, the variable current or voltage as a function of the displacements measured as output of the filter represents the global differential response of the filter.

Figure 16:
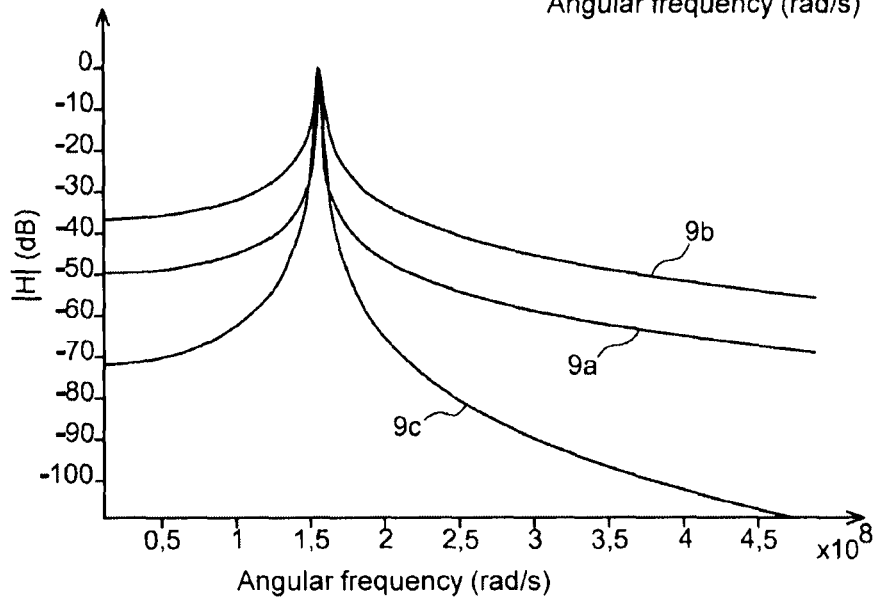
FIG. 16 shows the frequency responses of a single NEMS resonator and a resonant filter whereof the outputs of the matrices are processed additively or differentially.

This is illustrated by the frequency responses obtained for nominal beam lengths of the NEMS resonators of the two sets of matrices of 3,005 µm and 2,995 µm, respectively, shown in FIG. 16. The frequency response of a single NEMS resonator is shown by curve 9a. The frequency response of the filter when the outputs of the two sets of matrices are not processed differentially, but additively, is shown by curve 9b. Lastly, the frequency response of the filter when the outputs of the two sets of matrices are processed differentially is shown by curve 9c.

Generally, the deviation between the dimensions of the resonators of the two sets of matrices can be between 1% and 50%. This deviation will in particular be chosen as a function of the desired characteristics for the filter, and in particular its bandwidth.

The same advantages previously cited concerning the filter whereof the outputs of the matrices are processed additively are kept concerning the known and fixed response of the filter, which will simplify the design of the electronic processing circuit associated therewith, as well as the high gain. Moreover, in this case, the phase spreads even more linearly over the distribution interval of the resonance frequencies of the system and changes by 360 degrees instead of 180 degrees, which facilitates the phase control following the spreading of the catching interval in the case of closed loop resonance frequency monitoring of the global filter. The statistical gain is much lower and high-frequency noise is greatly rejected because the response has a very significant attenuation outside the bandwidth. The bandwidth is narrower than that obtained by the architecture previously described and the selectivity is increased.

A resonant filter whereof the outputs of two sets of matrices of NEMS resonators are processed differentially therefore makes it possible to obtain a selective filter with a high quality factor and a linear phase, thereby detecting the variation of the resonance frequency of the global system and subsequently measuring the variation of the parameters of the resonator (stiffness constant, quality factor, etc.) depending on external phenomena.

Figure 17:
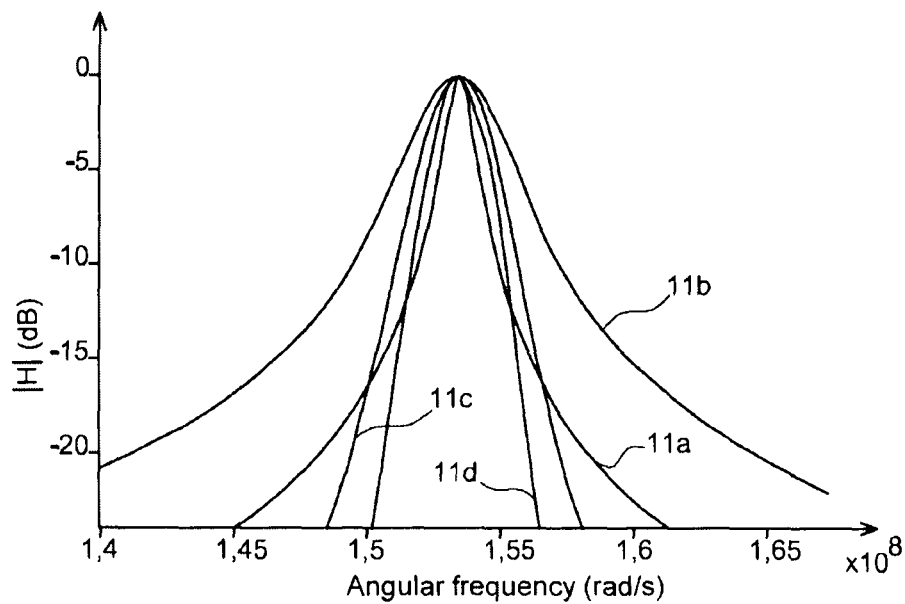
FIG. 17 shows the frequency responses of a single NEMS resonator, of a resonant filter, of two cascaded resonant filters, and of three cascaded resonant filters, when the outputs of said filters are processed additively.

It is possible to even further increase the selectivity by coupling several filters in a cascade, i.e. connected in series. Curve 11a shown in FIG. 17 illustrates the nominal frequency response of a NEMS resonator. Curve 11b shows the frequency response for a single resonant filter whereof the outputs are processed additively. Curve 11c shows the frequency response for two resonant filters in cascade whereof the outputs are processed additively. Lastly, curve 11d shows the frequency response for three resonant filters in cascade whereof the outputs are processed additively.

Figure 18:
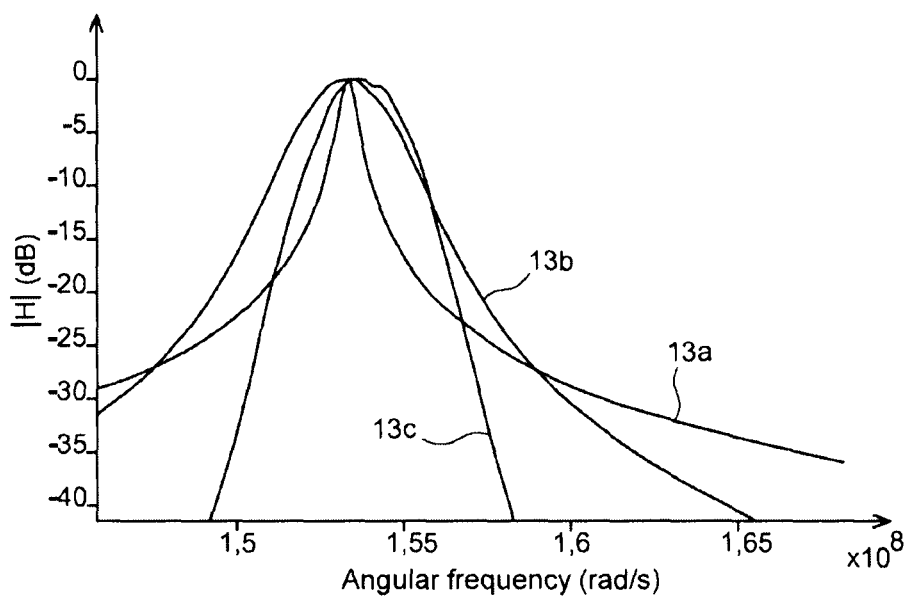
FIG. 18 shows the frequency responses of a single NEMS resonator and two cascaded resonant filters when the outputs of the matrices are processed additively or differentially.

The cascade structure of the filters makes it possible to obtain even more selectivity when the outputs of said filters are processed differentially. This is illustrated in FIG. 18: curve 13a shows the frequency response of a single NEMS resonator, curve 13b shows the frequency response of two resonant filters in cascade whereof the outputs are processed additively, curve 13c showing the frequency response of two resonant filters in cascade whereof the outputs are processed differentially.

The invention claimed is:

1. A resonant filter comprising:
at least two matrices, having different frequency responses, each matrix comprising, n×m resonators of the N/MEMS type with substantially similar dimensions and distributed in n rows and m columns, with n and m being integers strictly greater than 1, including for each resonator:
actuating means for exciting the resonator by controlling an input electric signal of the filter,
means for detecting movements of the resonator and for delivering an electrical output signal whereof the value depends on the detected movements;
an input of the filter, configured to receive an electrical input signal of the filter, being electrically connected to the actuating means of all of the resonators, the outputs of the detecting means of all of the resonators being electrically connected to each other and to an output of the filter, the resonators not being mechanically coupled to each other, and wherein nominal dimensions of the resonators of one matrix are different from nominal dimensions of the resonators of another matrix.

2. The filter according to claim 1, wherein a difference between the nominal dimensions of the resonators of the one matrix and the nominal dimensions of the resonators of the other matrix is between about 1% and 50%.

3. The filter according to claim 1, wherein each matrix includes a number of resonators such that the average of global response obtained as an output tends toward an expected value of individual response from a resonator.

4. The filter according to claim 1, wherein the resonators are of beam type, dimensions of the resonators corresponding to lengths of the beams.

5. The filter according to claim 1, wherein the actuating means of at least part of the resonators are of electrostatic type.

6. The filter according to claim 5, wherein actuating means of the electrostatic type of a resonator include a first electrode formed by at least one part of the resonator composed of an electrically conductive material and a second electrode spaced away from the first electrode, a control voltage being intended to be applied between the two electrodes.

7. The filter according to claim 6, wherein the second electrodes of the actuating means of the electrostatic type are formed by an electrode shared by all of the resonators of the matrix.

8. The filter according to claim 1, wherein the detecting means of at least part of the resonators are of capacitive type.

9. The filter according to claim 8, wherein the detecting means of the capacitive type of a resonator include capacity measuring means between an electrically conductive portion of the resonator and an electrode spaced away from the electrically conductive portion.

10. The filter according to claim 1, including a plurality of matrices of N/MEMS-type resonators electrically connected and parallel to each other such that the electrical signal to be obtained as an output of the filter corresponding to the sum of the electrical signals obtained as output of each matrix.

11. The filter according to claim 10, wherein the matrices are electrically connected to each other by microminiature circuitry.

12. The filter according to claim 10, wherein detecting means of the resonators of at least a first matrix, are configured to deliver electrical signals with values opposite electrical means of the resonators of at least a second matrix, and wherein the dimensions of the resonators of the at least a first matrix are different from the dimensions of the resonators of said at least a second matrix.

13. The filter according to claim 12, wherein detecting means of the resonators of a number of first matrices corresponding to half a total number of matrices of the filter are configured to deliver electrical signals of values opposite the electrical signal values intended to be delivered by detecting means of the resonators of a number of second matrices corresponding to half the total number of matrices of the filter.

14. The filter according to claim 1, the filter being made on a single substrate.

15. The filter according to claim 1, wherein the matrix includes between about 50 resonators and 10,000 resonators.

16. A resonant structure including plural resonant filters according to claim 1 electrically coupled to each other in series.

17. A resonant filter comprising:
at least a first set of resonators of N/MEMS type with similar first nominal dimensions; and
a second set of resonators with similar second nominal dimensions, the first nominal dimensions being different from the second nominal dimensions the first and second set of resonators having different frequency responses, including for each resonator;
actuating means for exciting the resonator by controlling an input electric signal of the filter,
means for detecting movements of the resonator and for delivering an electrical output signal whereof the value depends on the detected movements;
an input of the filter, configured to receive an electrical input signal of the filter, being electrically connected to the actuating means of all of the resonators, the outputs of the detecting means of all of the resonators being electrically connected to each other and to an output of the filter, the resonators not being mechanically coupled to each other.

\* \* \* \* \*